(12) United States Patent
Sohn et al.

(10) Patent No.: US 8,492,893 B1
(45) Date of Patent: Jul. 23, 2013

(54) SEMICONDUCTOR DEVICE CAPABLE OF PREVENTING DIELECTRIC LAYER FROM CRACKING

(75) Inventors: Eun Sook Sohn, Seoul (KR); Jin Young Kim, Seoul (KR); Tae Kyung Hwang, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 195 days.

(21) Appl. No.: 13/049,647

(22) Filed: Mar. 16, 2011

(51) Int. Cl.
*H01L 23/12* (2006.01)
*H01L 23/48* (2006.01)

(52) U.S. Cl.
USPC ..... 257/737; 257/778; 257/750; 257/E23.069

(58) Field of Classification Search
USPC .................................. 257/737, 778, E23.069
See application file for complete search history.

(56) References Cited

U.S. PATENT DOCUMENTS

| | | | |
|---|---|---|---|
| 5,334,804 A | 8/1994 | Love et al. | |
| 5,422,516 A | 6/1995 | Hosokawa et al. | |
| 5,796,591 A * | 8/1998 | Dalal et al. | 361/779 |
| 5,889,326 A * | 3/1999 | Tanaka | 257/737 |
| 5,920,126 A | 7/1999 | Sohara | |
| 5,969,952 A | 10/1999 | Hayashi et al. | |
| 6,049,122 A | 4/2000 | Yoneda | |
| 6,229,711 B1 | 5/2001 | Yoneda | |
| 6,287,893 B1 | 9/2001 | Elenius et al. | |
| 6,346,435 B1 | 2/2002 | Kikuchi et al. | |
| 6,365,435 B1 | 4/2002 | Wang et al. | |
| 6,462,426 B1 * | 10/2002 | Kelkar et al. | 257/781 |
| 6,467,676 B1 | 10/2002 | Wang | |
| 6,479,900 B1 | 11/2002 | Shinogi et al. | |
| 6,495,397 B2 | 12/2002 | Kubota et al. | |
| 6,510,976 B2 | 1/2003 | Hwee et al. | |
| 6,550,666 B2 | 4/2003 | Chew et al. | |
| 6,578,754 B1 | 6/2003 | Tung | |
| 6,592,019 B2 | 7/2003 | Tung | |
| 6,599,775 B2 | 7/2003 | Tie et al. | |
| 6,681,982 B2 | 1/2004 | Tung | |
| 6,732,913 B2 | 5/2004 | Alvarez | |
| 6,734,039 B2 | 5/2004 | Hwee et al. | |
| 6,750,082 B2 | 6/2004 | Briar et al. | |
| 6,786,736 B2 | 9/2004 | Flannery et al. | |

(Continued)

FOREIGN PATENT DOCUMENTS

| | | |
|---|---|---|
| JP | 11-074301 | 3/1999 |
| JP | 2001-068508 | 3/2001 |

OTHER PUBLICATIONS

Darveaux et al., "Fine Pitch Copper Pillar Package and Method", U.S. Appl. No. 12/414,220, filed Mar. 30, 2009.

*Primary Examiner* — Nitin Parekh
(74) *Attorney, Agent, or Firm* — McKay and Hodgson, LLP; Serge J. Hodgson

(57) ABSTRACT

A semiconductor device is disclosed. A conductive pillar for electrically connecting a semiconductor die to a circuit board may be gradually slimmed from the semiconductor die to the circuit board. A dummy conductive layer may be disposed between the semiconductor die and the conductive pillar. A width of an opening for opening a pattern of the circuit board may range from about 50% to 90% of the width of the lower end of the conductive pillar. Accordingly, a mechanical stress is prevented from being transmitted from the conductive pillar to the semiconductor die, or is absorbed by the dummy conductive layer, and thus, preventing cracks of the semiconductor die and a dielectric layer having a low dielectric constant.

16 Claims, 7 Drawing Sheets

U.S. PATENT DOCUMENTS

| | | |
|---|---|---|
| 6,929,981 B2 | 8/2005 | Hwee et al. |
| 7,087,458 B2 | 8/2006 | Wang et al. |
| 7,183,493 B2 | 2/2007 | Garcia et al. |
| 7,183,648 B2 | 2/2007 | Ramanathan et al. |
| 7,362,038 B1 | 4/2008 | Jang et al. |
| 7,391,112 B2 | 6/2008 | Li et al. |
| 7,456,496 B2 | 11/2008 | Hwee et al. |
| 7,462,942 B2 | 12/2008 | Tan et al. |
| 7,795,071 B2 | 9/2010 | Hwee-Seng Jimmy et al. |
| 2002/0113312 A1* | 8/2002 | Clatanoff et al. ............. 257/737 |
| 2002/0171152 A1* | 11/2002 | Miyazaki ...................... 257/778 |
| 2005/0077624 A1 | 4/2005 | Tan et al. |
| 2005/0098886 A1 | 5/2005 | Pendse |
| 2007/0096316 A1 | 5/2007 | Schofield et al. |
| 2008/0136019 A1* | 6/2008 | Johnson et al. ............... 257/737 |

\* cited by examiner

SEMICONDUCTOR DEVICE CAPABLE OF PREVENTING DIELECTRIC LAYER FROM CRACKING

TECHNICAL FIELD

The present application relates to a semiconductor device.

BACKGROUND

Miniaturization, light-weighting, and high performance of electronic products are bound up with miniaturization, light-weighting, and high performance of electronic parts. To this end, designs and manufacturing technologies of semiconductors, and technologies of various semiconductor devices are developed.

A flip-chip technology is a representative one of these technologies. Particularly, the flip-chip technology using a conductive pillar that is longer and slimmer than a solder bump can achieve a fine pitch, and absorb a mechanical stress occurring between a semiconductor die and a circuit board to prevent a crack of the semiconductor die.

Furthermore, dielectrics having low dielectric constants are recently used in semiconductor dies to form more integrated circuits. The dielectrics having low dielectric constants, which reduce cross talk and/or resistance-capacitance (RC) between circuit patterns, are used for highly-integrated semiconductor dies.

However, since the dielectrics having low dielectric constants are hard and fragile, the dielectrics are susceptible to an internal or external stress. For example, a dielectric layer and/or a semiconductor die may be easily cracked by a stress due to a thermal expansion gradient between the semiconductor die and a circuit board. Although a conductive pillar absorbs the stress, the absorbance of the conductive pillar is limited in the semiconductor die including the dielectric having a low dielectric constant.

BRIEF DESCRIPTION OF THE DRAWINGS

In the following description, the same or similar elements are labeled with the same or similar reference numbers.

DETAILED DESCRIPTION

Figure 1A:
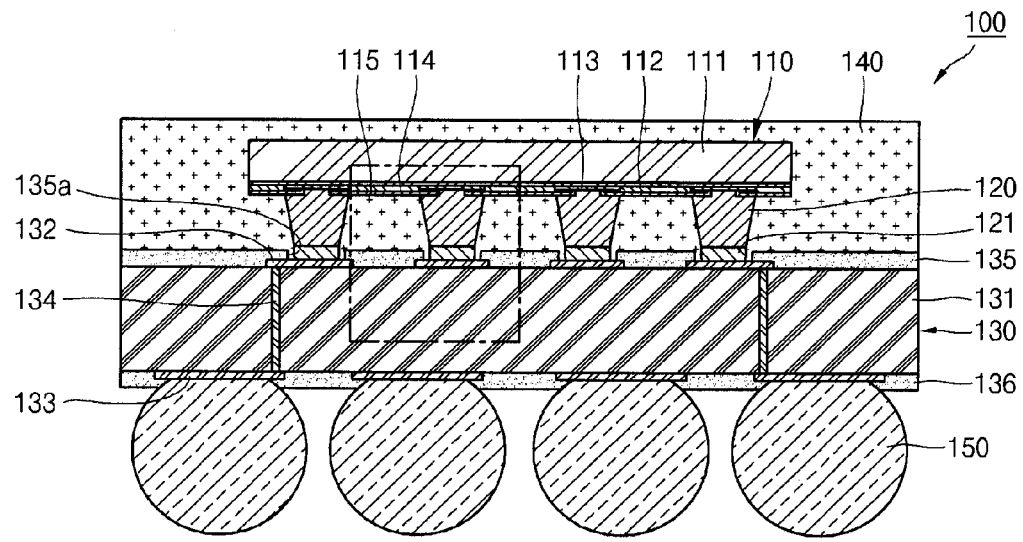
FIGS. 1A and 1B are a cross-sectional view and a partial enlarged cross-sectional view, which illustrate a semiconductor device according to an embodiment.
Figure 1B:
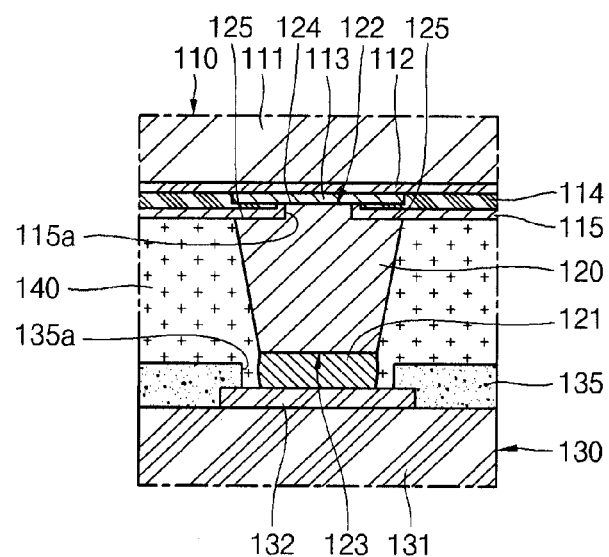

Referring to FIGS. 1A and 1B, a cross-sectional view and a partial enlarged cross-sectional view of a semiconductor device 100 are illustrated according to an embodiment. As illustrated in FIGS. 1A and 1B, the semiconductor device 100 according to the current embodiment includes a semiconductor die 110, conductive pillars 120 electrically connected to the semiconductor die 110, a circuit board 130 electrically connected to the conductive pillars 120, an encapsulant 140 encapsulating the semiconductor die 110 and the conductive pillars 120 on the circuit board 130, and solder balls 150 electrically connected to the circuit board 130.

The semiconductor die 110 includes a semiconductor body 111 in which a plurality of electronic circuits (not shown) are integrated, a dielectric layer 112 having a low dielectric constant and disposed on the semiconductor body 111, bond pads 113 electrically connected to the electronic circuits, a first protective layer 114 covering the dielectric layer 112 having the low dielectric constant and the bond pad 113, and a second protective layer 115 covering the first protective layer 114.

The semiconductor body 111 may be one of a silicon semiconductor, a silicon germanium semiconductor, and an equivalent thereof, but the present embodiment is not limited thereto.

The dielectric layer 112 is disposed on the semiconductor body 111 and the dielectric constant thereof is about 4 or less. The dielectric layer 112 may be, for example, one of $SiO_2$ thin film (dielectric constant of 3.5) doped with fluorine (F), $SiO_2$ thin film (dielectric constant of 3.0) doped with carbon (C), $SiO_2$ thin film (dielectric constant of 2.0) including a plurality of air bubbles, and an equivalent thereof, but the present embodiment is not limited thereto.

Although the dielectric layer 112 is exemplified as a single layer in FIGS. 1A and 1B, the dielectric layer 112 may be a multi layer.

The bond pads 113 are disposed on the dielectric layer 112, and are electrically connected to the electronic circuits. The bond pads 113 may be formed of one of aluminum, copper, and an equivalent thereof, but the present embodiment is not limited thereto.

The first protective layer 114 covers the dielectric layer 112 and the bond pads 113. Since the conductive pillars 120 are connected to the bond pads 113, the first protective layer 114 partially exposes the bond pads 113. The first protective layer 114 may be formed of one of polyimide (PI), benzo cyclo butene (BCB), poly benz oxazole (PBO), bismaleimidetriazine (BT), phenolic resin, epoxy, silicone, an oxide layer ($SiO_2$), a nitride layer ($Si_3N_4$), and an equivalent thereof, but the present embodiment is not limited thereto.

The second protective layer 115 may cover the first protective layer 114, and be formed of the same material as that of the first protective layer 114. The second protective layer 115 has openings 115a to open predetermined regions of the bond pads 113, so that the conductive pillars 120 can be electrically connected to the bond pads 113 through the open regions.

The conductive pillars 120 include upper ends 122 and opposite lower ends 123. The upper ends 122 further include upper central regions 124 and upper peripheries 125 surrounding the upper central regions 124.

The conductive pillars 120 are electrically connected to the bond pads 113 through the openings 115a formed in the second protective layer 115. The upper center region 124 of the conductive pillar 120 is electrically connected to the bond pad 113, and the upper periphery 125 thereof is in direct contact with the second protective layer 115.

The conductive pillar 120 is slimmed from the semiconductor die 110 to the circuit board 130. That is, the width or diameter of the conductive pillar 120 gradually decreases from the upper end 122 at the semiconductor die 110 to the lower end 123 at the circuit board 130. In other words, the conductive pillar 120 has a reverse trapezoid cross section.

The conductive pillar 120 may be formed of one of copper (Cu), and an equivalent thereof, but the present embodiment is not limited thereto.

A solder 121 is electrically connected to the circuit board 130 and is attached to the lower end 123 of the conductive pillar 120. The solder 121 may be formed of one of Sn, Sn/Pb, a eutectic solder (Sn37Pb), a high lead solder (Sn95Pb), a lead-free solder (SnAg, SnAu, SnCu, SnZn, SnZnBi, SnAgCu, or SnAgBi), and an equivalent thereof, but the present embodiment is not limited thereto.

That is, since the conductive pillar 120 has a melting point ranging from about 900° C. to about 1100° C., it is difficult to connect the conductive pillar 120 to the circuit board 130. However, since the solder 121 has a melting point ranging from about 150° C. to about 300° C., it is easy to connect the solder 121 to the circuit board 130.

The solder 121 has a height that is about 1% to 10% of the height of the conductive pillar 120. However, the height of the solder 121 is not limited thereto.

The circuit board 130 includes an insulation layer 131, a plurality of first patterns 132 disposed on the upper surface of the insulation layer 131, a plurality of second patterns 133 disposed on the lower surface of the insulation layer 131, conductive vias 134 connecting the first patterns 132 to the second patterns 133, a first solder mask 135 covering the first patterns 132, and a second solder mask 136 covering the second patterns 133.

The conductive pillars 120 are electrically connected to the first patterns 132. That is, the solders 121 disposed on the lower ends 123 of the conductive pillars 120 are electrically connected to the first patterns 132.

The first solder mask 135 has openings 135a having a predetermined size to efficiently connect the conductive pillars 120 to the first patterns 132. Thus, predetermined regions of the first pattern 132 are exposed through the opening 135a.

The width of the lower end 123 of the conductive pillar 120 is smaller than the width of the opening 135a of the first solder mask 135. The width of the upper end 122 of the conductive pillar 120 is greater than the width of the opening 135a of the first solder mask 135.

The encapsulant 140 covers the semiconductor die 110 and the conductive pillars 120 on the circuit board 130 to protect the semiconductor die 110 and the conductive pillars 120 from the exterior thereof. The encapsulant 140 may be formed of epoxy and inorganic filler in one embodiment.

When the inorganic filler is smaller than a gap or space between the semiconductor die 110 and the circuit board 130, the encapsulant 140 may fill the gap or space between the semiconductor die 110 and the circuit board 130. The gap or space between the semiconductor die 110 and the circuit board 130 may be separately filled with a typical underfill.

The solder balls 150 are electrically connected to the circuit board 130. That is, the solder balls 150 are electrically connected to the second patterns 133 disposed on the circuit board 130. The solder balls 150 are used to electrically connect the semiconductor die 110 to an external device.

The solder balls 150 may be formed of one of a eutectic solder (Sn37Pb), a high lead solder (Sn95Pb), a lead-free solder (SnAg, SnAu, SnCu, SnZn, SnZnBi, SnAgCu, or SnAgBi), and an equivalent thereof, but the present embodiment is not limited thereto.

Accordingly, since the width of the conductive pillars 120 gradually decreases from the semiconductor die 110 to the circuit board 130 in the semiconductor device 100 according to this embodiment, a mechanical stress is concentrated to the circuit board 130 instead of the semiconductor die 110, thereby preventing a crack of the semiconductor die 110.

For example, since a mechanical stress due to a thermal expansion gradient between the semiconductor die 110 and the circuit board 130 is concentrated to bonding surfaces of the circuit board 130 (to the interfaces between the conductive pillars 120 and the first patterns 132), instead of the dielectric layer 112 of the semiconductor die 110, a crack of the dielectric layer 112 of the semiconductor die 110 is prevented.

In the semiconductor device 100 according to this embodiment, the width of the opening 115a of the second protective layer 115 is smaller than the width of the upper end 122 of the conductive pillar 120. Thus, when the upper center region 124 of the conductive pillar 120 passes through the opening 115a and connects to the bond pad 113, the upper periphery 125 of the conductive pillar 120 is in direct contact with the second protective layer 115 around the opening 115a. Thus, a mechanical stress transmitted from the conductive pillar 120 is absorbed by the second protective layer 115, and thus, is removed.

Figure 2:
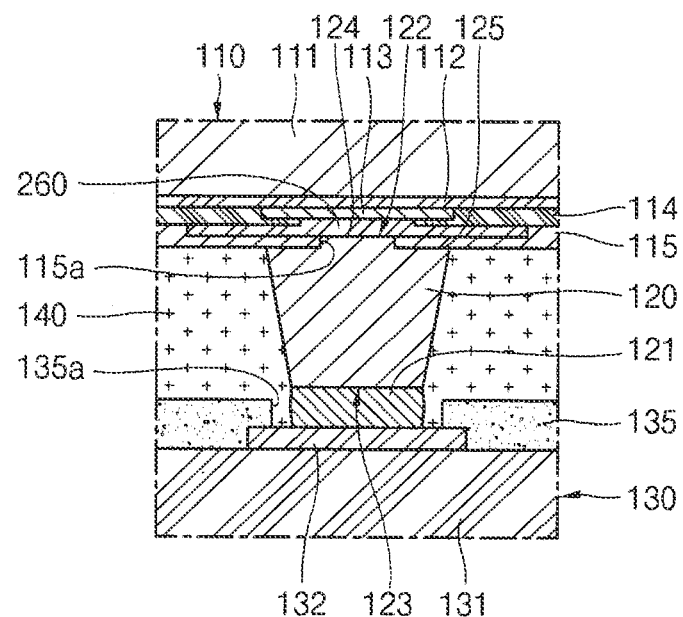
FIGS. 2, 3, 4, 5, 6, 7, 8, 9, 10, 11 are partial enlarged cross-sectional views illustrating semiconductor devices according to various embodiments.

Referring to FIG. 2, a partial enlarged cross-sectional view of a semiconductor device is illustrated according to another embodiment. As illustrated in FIG. 2, the semiconductor device according to the current embodiment further include a dummy conductive layer 260 between the bond pad 113 and the conductive pillar 120.

The dummy conductive layer 260 is electrically and mechanically connected to the bond pad 113, and covers the first protective layer 114 around the bond pad 113. The width of the dummy conductive layer 260 is greater than the width of the bond pad 113. The width of the dummy conductive layer 260 is greater than the width of the upper end 122 of the conductive pillar 120. As the width of the dummy conductive layer 260 increases, absorbance of a mechanical stress transmitted from the conductive pillar 120 is increased.

The dummy conductive layer 260 is covered with the second protective layer 115. The dummy conductive layer 260 may be formed of one of copper, aluminum, gold, silver, stannum (tin), stannum (tin) alloy, nickel, palladium, and an equivalent thereof, but the present embodiment is not limited thereto.

The upper center region 124 of the conductive pillar 120 passes through the opening 115a of the second protective layer 115 and electrically and mechanically connects to the dummy conductive layer 260. However, since the opening 115a of the second protective layer 115 is smaller than the width of the upper end 122 of the conductive pillar 120, the second protective layer 115 is disposed between the upper periphery 125 of the conductive pillar 120 and the dummy conductive layer 260 disposed at the periphery of the opening 115a.

Accordingly, since the dummy conductive layer 260 is disposed between the bond pad 113 and the conductive pillar 120 in the current embodiment, the dummy conductive layer 260 absorbs and buffers a mechanical stress. Thus, cracks of the semiconductor die 110 and the dielectric layer 112 due to a mechanical stress are prevented.

In addition, since the second protective layer 115 is disposed between the dummy conductive layer 260 and the upper periphery 125 of the conductive pillar 120 in the current embodiment, the second protective layer 115 absorbs a mechanical stress transmitted from the conductive pillar 120.

Figure 3:
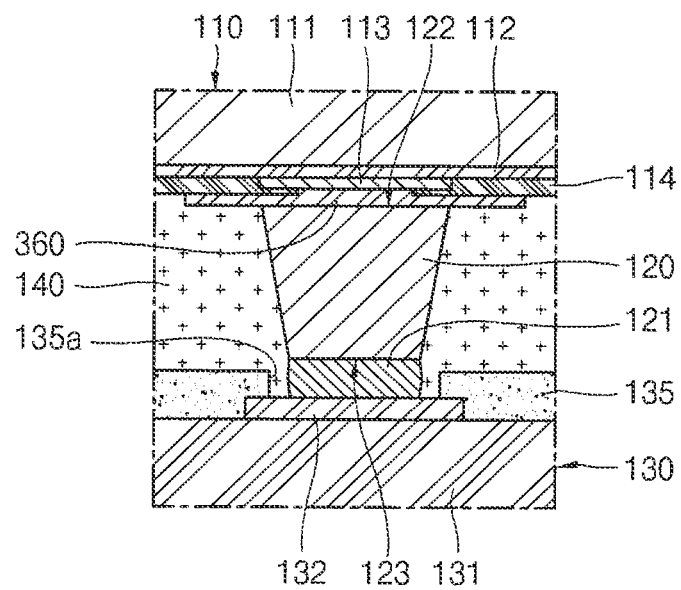

Referring to FIG. 3, a partial enlarged cross-sectional view of a semiconductor device is illustrated according to another embodiment. As illustrated in FIG. 3, according to the current embodiment, a dummy conductive layer 360 is disposed between the bond pad 113 and the conductive pillar 120, and the dummy conductive layer 360 is not covered with the second protective layer 115. That is, the dummy conductive layer 360 is exposed, and the second protective layer 115 is omitted.

The conductive pillar 120 is connected to the dummy conductive layer 360. That is, the entire upper end 122 of the conductive pillar 120 is connected to the dummy conductive layer 360. Accordingly, a bonding area between the conductive pillar 120 and the dummy conductive layer 360 increases, and thus, an electric resistance between the conductive pillar 120 and the dummy conductive layer 360 decreases.

Figure 4:
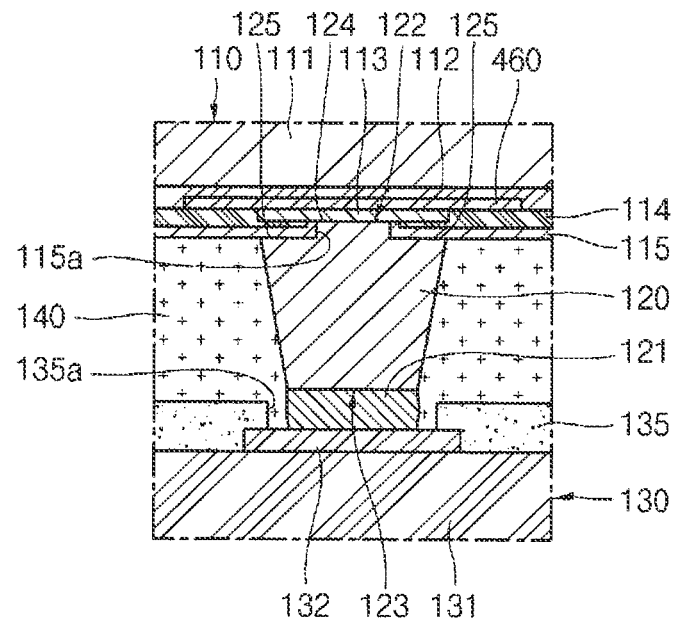

Referring to FIG. 4, a partial enlarged cross-sectional view of a semiconductor device is illustrated according to another embodiment. As illustrated in FIG. 4, the semiconductor device according to the current embodiment further include a dummy conductive layer 460 between the bond pad 113 and the dielectric layer 112.

The dummy conductive layer 460 is disposed on the dielectric layer 112. The bond pad 113 is disposed on the dummy conductive layer 460. The bond pad 113 and the dummy conductive layer 460 are covered with the first protective layer 114.

The width of the dummy conductive layer 460 is greater than the width of the bond pad 113. The width of the dummy conductive layer 460 is greater than the width of the upper end 122 of the conductive pillar 120.

The dummy conductive layer 460 may be formed of one of copper, aluminum, gold, silver, stannum (tin), stannum (tin) alloy, nickel, palladium, and an equivalent thereof, but the present embodiment is not limited thereto.

The upper center region 124 of the conductive pillar 120 passes through the opening 115a of the second protective layer 115, and connects to the bond pad 113. The second protective layer 115 is disposed between the bond pad 113 and the upper periphery 125 of the conductive pillar 120.

Accordingly, since the conductive pillar 120 is bonded directly to the bond pad 113 instead of the dummy conductive layer 460 in the current embodiment, an electric resistance between the bond pad 113 and the conductive pillar 120 decreases.

In addition, since the dummy conductive layer 460 absorbs a mechanical stress transmitted from the bond pad 113 and the conductive pillar 120, cracks of the semiconductor die 110 and the dielectric layer 112 are more effectively prevented.

Figure 5:
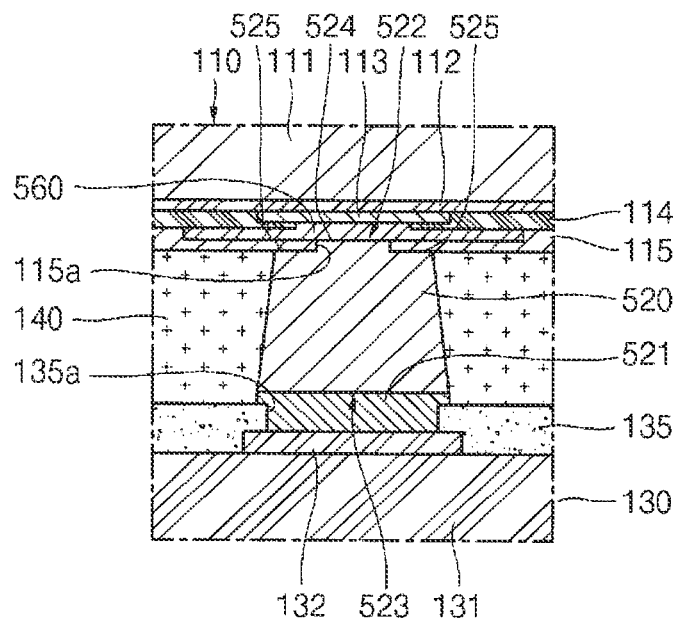

Referring to FIG. 5, a partial enlarged cross-sectional view of a semiconductor device is illustrated according to another embodiment. As illustrated in FIG. 5, the semiconductor device according to the current embodiment includes a conductive pillar 520 that increases in thickness from the semiconductor die 110 to the circuit board 130. That is, the upper end 522 of the conductive pillar 520 is slimmest, and the lower end 523 thereof is thickest. In other words, the conductive pillar 520 has a trapezoid cross section.

In addition, a dummy conductive layer 560 is disposed between the bond pad 113 and the conductive pillar 520. The dummy conductive layer 560 is covered with the second protective layer 115. However, the second protective layer 115 has the opening 115a to connect the dummy conductive layer 560 to the upper center region 524 of the conductive pillar 520.

The opening 135a of the first solder mask 135 disposed on the circuit board 130 is slightly smaller than the width of the lower end 523 of the conductive pillar 520. Thus, a solder 521 disposed on the lower end 523 of the conductive pillar 520 completely fills the opening 135a.

Accordingly, although the thickness of the conductive pillar 520 gradually increases from the semiconductor die 110 to the circuit board 130 in the current embodiment, the dummy conductive layer 560 is disposed between the bond pad 113 and the conductive pillar 520 to absorb a mechanical stress. Thus, cracks of the semiconductor die 110 and the dielectric layer 112 due to a mechanical stress are prevented.

In addition, according to the current embodiment, the upper periphery 525 of the upper end 522 of the conductive pillar 520 is in direct contact with the second protective layer 115, and the lower end 523 of the conductive pillar 520, that is, the solder 521 is in close contact with the first solder mask 135. Thus, since the second protective layer 115 and the first solder mask 135 absorb a stress transmitted from the conductive pillar 520, cracks of the semiconductor die 110 and the dielectric layer 112 are more effectively prevented.

Figure 6:
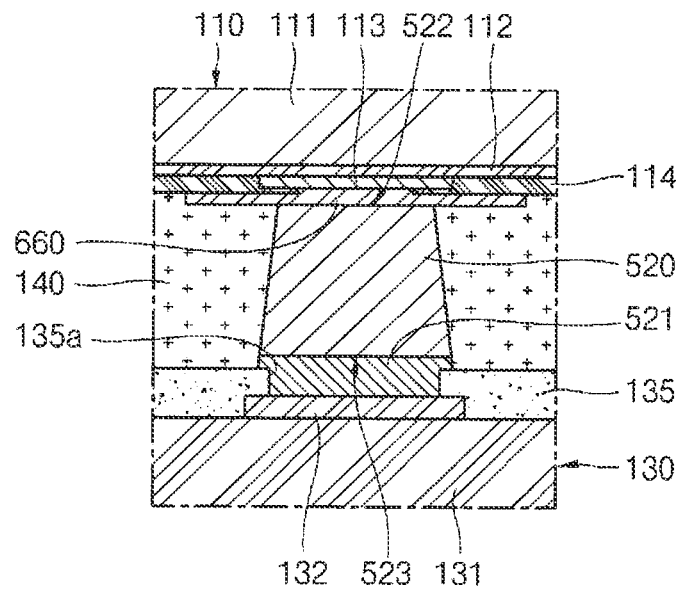

Referring to FIG. 6, a partial enlarged cross-sectional view of a semiconductor device is illustrated according to another embodiment. As illustrated in FIG. 6, according to the current embodiment, a dummy conductive layer 660 is disposed between the bond pad 113 and the conductive pillar 520, and the dummy conductive layer 660 is not covered with the second protective layer 115. That is, the dummy conductive layer 660 is exposed, and the second protective layer 115 is omitted.

The conductive pillar 520 is connected to the dummy conductive layer 660. That is, the entire upper end 522 of the conductive pillar 520 is connected to the dummy conductive layer 660.

Accordingly, an electric resistance between the conductive pillar 520 and the dummy conductive layer 660 decreases in the current embodiment, and thus, an electric resistance between the bond pad 113 and the conductive pillar 520 also decreases.

Figure 7:
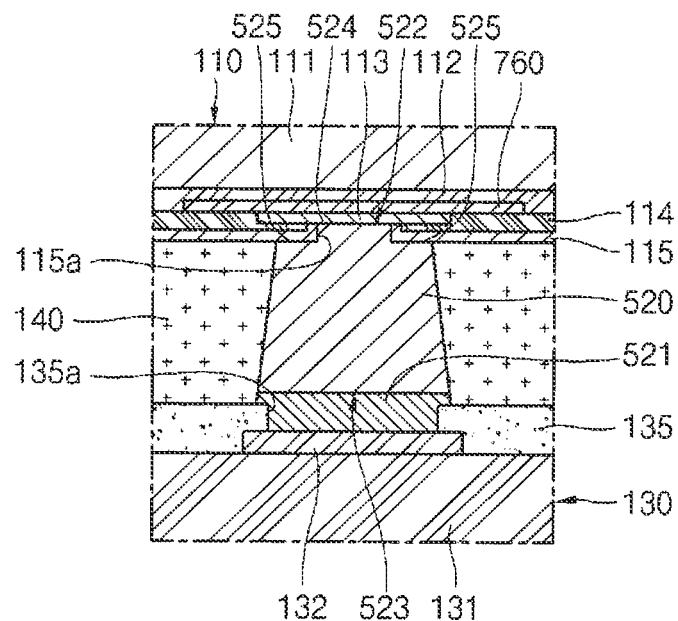

Referring to FIG. 7, a partial enlarged cross-sectional view of a semiconductor device is illustrated according to another embodiment. As illustrated in FIG. 7, the semiconductor device according to the current embodiment further include a dummy conductive layer 760 between the bond pad 113 and the dielectric layer 112.

The dummy conductive layer 760 is disposed on the dielectric layer 112. The bond pad 113 is disposed on the dummy conductive layer 760. The bond pad 113 and the dummy conductive layer 760 are covered with the first protective layer 114. The width of the dummy conductive layer 760 is greater than the width of the bond pad 113. The width of the dummy conductive layer 760 is greater than the width of the upper end 522 of the conductive pillar 520. The dummy conductive layer 760 may be formed of one of aluminum, copper, and an equivalent thereof, but the present embodiment is not limited thereto.

The upper center region 524 of the conductive pillar 520 passes through the second protective layer 115, and connects to the bond pad 113. The second protective layer 115 is disposed between the bond pad 113 and the upper periphery 525 of the conductive pillar 520.

Figure 8:
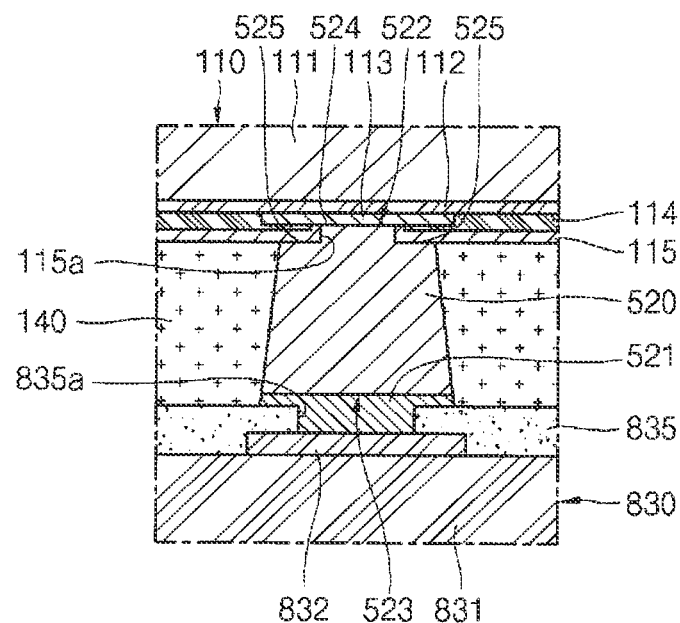

Referring to FIG. 8, a partial enlarged cross-sectional view of a semiconductor device is illustrated according to another embodiment. As illustrated in FIG. 8, the semiconductor device according to the current embodiment includes the conductive pillar 520 that gradually increases in thickness from the semiconductor die 110 to a circuit board 830. That is, the upper end 522 of the conductive pillar 520 is slimmest, and the lower end 523 thereof is thickest.

An opening 835a of a first solder mask 835 disposed on the circuit board 830 is smaller than the width of the lower end 523 of the conductive pillar 520. Thus, the solder 521 disposed on the lower end 523 of the conductive pillar 520 completely fills the opening 835a. The opening 835a has a width that is about 50% to 90% of the width of the lower end 523 of the conductive pillar 520.

When the width of the opening 835a is smaller than about 50% of the width of the conductive pillar 520, an electrical bonding area between the conductive pillar 520 and a first pattern 832 disposed on the circuit board 830 decreases, and thus bonding force between the conductive pillar 520 and the circuit board 830 decreases.

When the width of the opening 835a is greater than about 90% of the width of the conductive pillar 520, absorbance of the first solder mask 835 for a mechanical stress decreases. As such, when the absorbance of the first solder mask 835 for a mechanical stress decreases, the mechanical stress is concentrated to a bonding surface between the bond pad 113 and the conductive pillar 520 to cause a crack of the semiconductor die 110 or the dielectric layer 112.

Accordingly, although the thickness of the conductive pillar 520 gradually increases from the semiconductor die 110 to the circuit board 830 in the current embodiment, the opening 835a of the first solder mask 835 disposed on the circuit board 830 is optimized, so that the first solder mask 835 can absorb and buffer a mechanical stress. Thus, cracks of the semiconductor die 110 and the dielectric layer 112 due to a mechanical stress are prevented.

Figure 9:
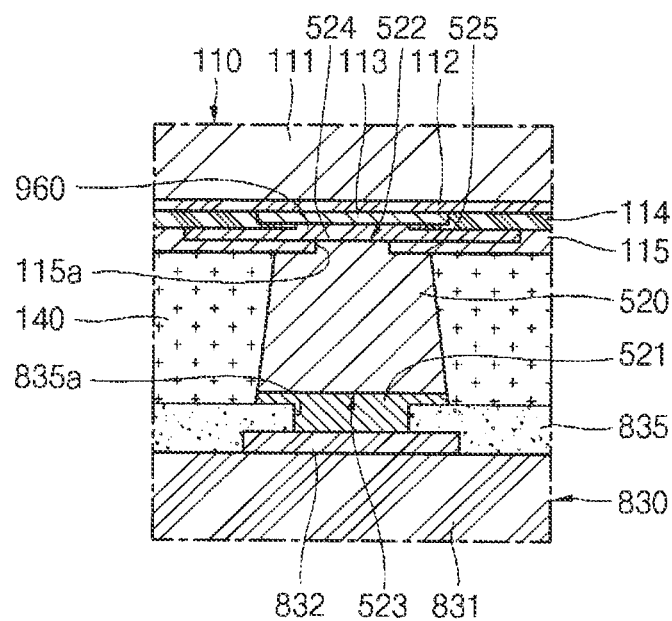

Referring to FIG. 9, a partial enlarged cross-sectional view of a semiconductor device is illustrated according to another embodiment. As illustrated in FIG. 9, the semiconductor device according to the current embodiment further include a dummy conductive layer 960 between the bond pad 113 and the conductive pillar 520.

The dummy conductive layer 960 is connected to the bond pad 113, and covers the first protective layer 114 around the bond pad 113. The dummy conductive layer 960 is covered with the second protective layer 115. The upper center region 524 of the conductive pillar 520 passes through the opening 115a of the second protective layer 115, and connects to the dummy conductive layer 960.

Accordingly, since the dummy conductive layer 960 is disposed between the bond pad 113 and the conductive pillar 520 in the current embodiment, the dummy conductive layer 960 absorbs and buffers a mechanical stress. Thus, cracks of the semiconductor die 110 and the dielectric layer 112 due to a mechanical stress are prevented.

Figure 10:
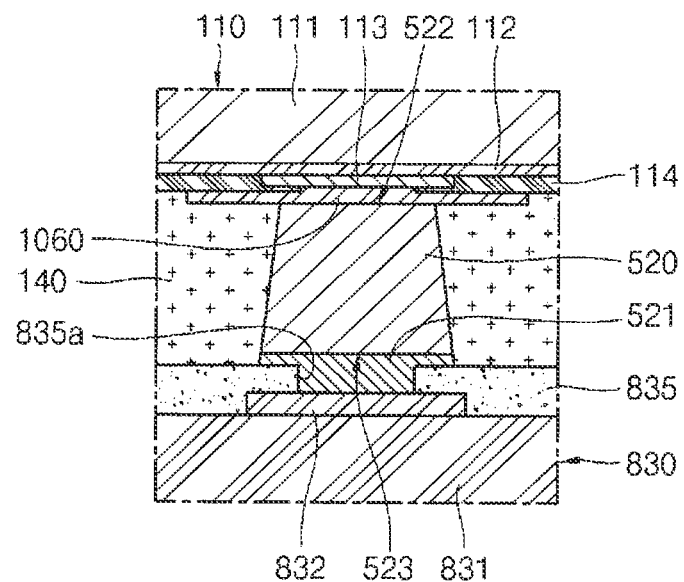

Referring to FIG. 10, a partial enlarged cross-sectional view of a semiconductor device is illustrated according to another embodiment. As illustrated in FIG. 10, according to the current embodiment, a dummy conductive layer 1060 is disposed between the bond pad 113 and the conductive pillar 520, and the dummy conductive layer 1060 is not covered with the second protective layer 115. That is, the dummy conductive layer 1060 is exposed, and the second protective layer 115 is omitted.

The conductive pillar 520 is connected to the dummy conductive layer 1060. That is, the entire upper end 522 of the conductive pillar 520 is connected to the dummy conductive layer 1060.

Figure 11:
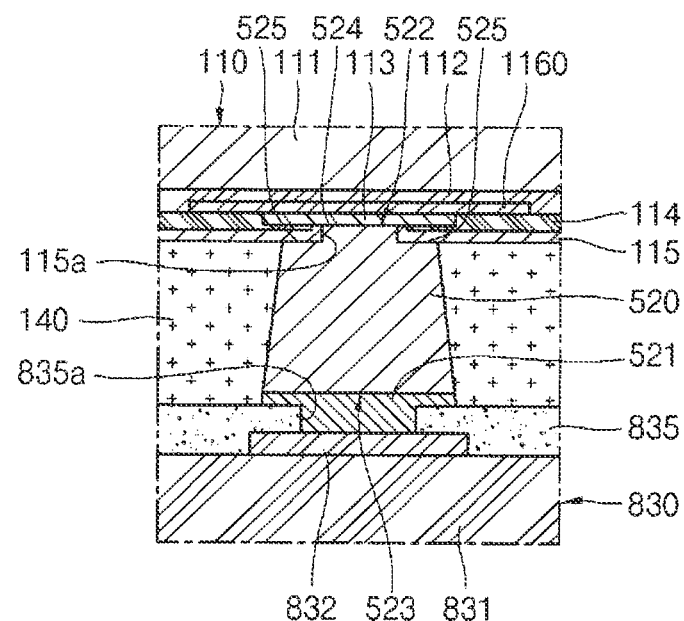

Referring to FIG. 11, a partial enlarged cross-sectional view of a semiconductor device is illustrated according to another embodiment. As illustrated in FIG. 11, the semiconductor device according to the current embodiment further include a dummy conductive layer 1160 between the bond pad 113 and the dielectric layer 112.

The dummy conductive layer 1160 is disposed on the dielectric layer 112. The bond pad 113 is disposed on the dummy conductive layer 1160. The bond pad 113 and the dummy conductive layer 1160 are covered with the first protective layer 114. The width of the dummy conductive layer 1160 is greater than the width of the bond pad 113. The width of the dummy conductive layer 1160 is greater than the width of the upper end 522 of the conductive pillar 520. The dummy conductive layer 1160 may be formed of one of aluminum, copper, and an equivalent thereof, but the present embodiment is not limited thereto.

The upper center region 524 of the conductive pillar 520 passes through the opening 115a of the second protective layer 115, and connects to the bond pad 113. The second protective layer 115 is disposed between the bond pad 113 and the upper periphery 525 of the conductive pillar 520.

Figure 12:
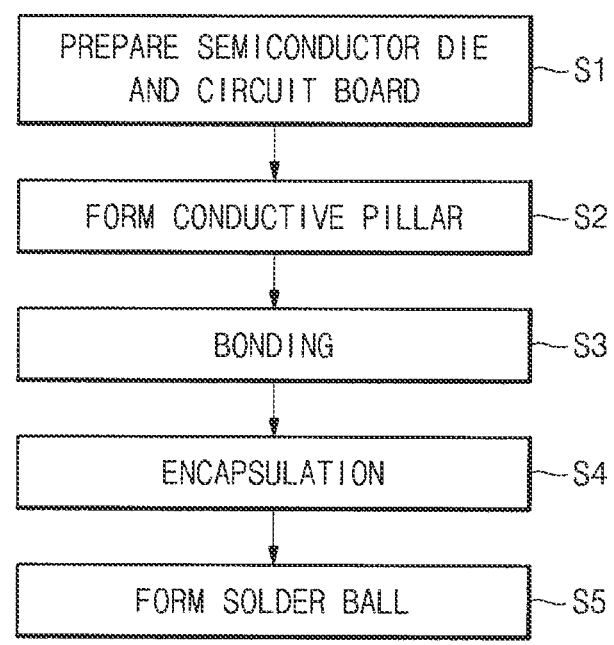
FIG. 12 is a flowchart illustrating a method of manufacturing a semiconductor device according to another embodiment.

Referring to FIG. 12, a flowchart of a method of manufacturing a semiconductor device is illustrated according to another embodiment. As illustrated in FIG. 12, the method of manufacturing the semiconductor device according to the current embodiment includes a prepare semiconductor die and circuit board operation S1 in which a semiconductor die and a circuit board are prepared, a form conductive pillar operation S2, a bonding operation S3, an encapsulation operation S4, and a form solder ball operation S5.

In the prepare semiconductor die and circuit board operation S1, a semiconductor die including a dielectric layer having a low dielectric constant and a bond pad, and a circuit board including a circuit pattern and a solder mask are prepared.

A dummy conductive layer may be disposed on the upper or lower surface of the bond pad of the semiconductor die. The solder mask of the circuit board may have an opening that opens the circuit pattern and have a smaller size than a typical size.

In the form conductive pillar operation S2, a conductive pillar is formed on the semiconductor die. At this point, the conductive pillar may be connected to the bond pad, or to the dummy conductive layer. The conductive pillar may be gradually slimmed or thickened in a direction going away from the semiconductor die. A solder having a low melting point for connecting to the circuit board may be formed on an end of the conductive pillar.

In the bonding operation S3, the conductive pillar is electrically connected to the circuit pattern of the circuit board. That is, the conductive pillar disposed on the semiconductor die is aligned with the circuit pattern on the circuit board, and then, is heated at a temperature ranging from about 150° C. to about 300° C. such that the solder disposed on the end of the conductive pillar is melted to be electrically and mechanically connected to the circuit pattern of the circuit board.

In the encapsulation operation S4, the semiconductor die and the conductive pillar on the circuit board are encapsulated with an encapsulant. The encapsulant includes an inorganic filler that is smaller than a gap between the semiconductor die and the circuit board to fill the gap. The gap between the semiconductor die and the circuit board may be filled with a separate underfill.

In the form solder ball operation S5, a solder ball is attached to the circuit pattern formed on the circuit board. For example, a flux is dotted on the circuit pattern of the circuit board, and then, a solder ball is temporarily attached to the flux and is heated at a temperature ranging from about 150° C. to about 300° C. such that the flux is volatilized and the solder ball is melted to be attached to the circuit pattern of the circuit board. The flux removes oxide films from the circuit pattern and the solder ball, and includes resin, isopropyl alcohol, and an active agent.

Thus, according to the method of manufacturing the semiconductor device according to the current embodiment, a mechanical stress from the conductive pillar is transmitted to the circuit board instead of the semiconductor die, or is absorbed by the dummy conductive layer disposed on the semiconductor die, thereby preventing cracks of the semiconductor die or the dielectric layer having a lower dielectric constant.

Although specific embodiments were described herein, the scope of the invention is not limited to those specific embodiments. Numerous variations, whether explicitly given in the specification or not, such as differences in structure, dimension, and use of material, are possible. The scope of the invention is at least as broad as given by the following claims.

What is claimed is:

1. A semiconductor device comprising:
   a semiconductor die comprising a bond pad;
   a conductive pillar coupled to the bond pad of the semiconductor die;
   a circuit board coupled to the conductive pillar, wherein a width of the conductive pillar gradually decreases from an upper end of the conductive pillar at the semiconductor die to a lower end of the conductive pillar at the circuit board; and
   a dummy conductive layer between the bond pad and the semiconductor die.

2. The semiconductor device of claim 1, wherein the semiconductor die comprises a dielectric layer having a dielectric constant of about 4 or less.

3. The semiconductor device of claim 1 further comprising a protective layer having an opening therein, wherein an upper center region of the upper end passes through the opening to be directly connected to the bond pad, and wherein the protective layer is between an upper periphery of the upper end and the bond pad.

4. The semiconductor device of claim 1, wherein the circuit board comprises:
   a circuit pattern; and
   a solder mask, wherein the solder mask has an opening to allow the circuit pattern to be connected to the conductive pillar, and wherein the opening of the solder mask has a width greater than a width of the lower end of the conductive pillar.

5. The semiconductor device of claim 4, wherein a solder is disposed between the conductive pillar and the circuit pattern.

6. A semiconductor device comprising:
   a semiconductor die comprising a bond pad;
   a conductive pillar coupled to the bond pad of the semiconductor die;
   a circuit board coupled to the conductive pillar, wherein a width of the conductive pillar gradually decreases from an upper end of the conductive pillar at the semiconductor die to a lower end of the conductive pillar at the circuit board; and
   a dummy conductive layer between the bond pad and the conductive pillar.

7. The semiconductor device of claim 6 wherein a width of the dummy conductive layer is greater than a width of the upper end of the conductive pillar.

8. The semiconductor device of claim 6 further comprising a protective layer having an opening therein, wherein an upper center region of the upper end passes through the opening to be directly connected to the dummy conductive layer, and wherein the protective layer is between an upper periphery of the upper end and the dummy conductive layer.

9. The semiconductor device of claim 6 wherein the entire upper end of the conductive pillar is directly connected to the dummy conductive layer.

10. A semiconductor device comprising:
    a semiconductor die;
    a conductive pillar coupled to the semiconductor die; and
    a circuit board coupled to the conductive pillar, wherein a width of the conductive pillar gradually increases from an upper end of the conductive pillar at the semiconductor die to a lower end of the conductive pillar at the circuit board, wherein the circuit board comprises:
    a circuit pattern; and
    a solder mask, wherein the solder mask has an opening to allow the circuit pattern to be connected to the conductive pillar, and wherein the opening of the solder mask has a width smaller than a width of the lower end of the conductive pillar.

11. The semiconductor device of claim 10, wherein the width of the opening of the solder mask ranges from about 50% to about 90% of the width of the lower end of the conductive pillar.

12. The semiconductor device of claim 10, wherein a solder is disposed between the conductive pillar and the circuit board, the solder completely filling the opening of the solder mask.

13. A semiconductor device comprising:
    a semiconductor die;
    a conductive pillar coupled to the semiconductor die;
    a circuit board coupled to the conductive pillar, wherein a width of the conductive pillar gradually increases from an upper end of the conductive pillar at the semiconductor die to a lower end of the conductive pillar at the circuit board; and
    a dummy conductive layer disposed between the semiconductor die and the conductive pillar.

14. The semiconductor device of claim 13, wherein the semiconductor die comprises a bond pad, and the dummy conductive layer is disposed between the bond pad and the conductive pillar.

15. The semiconductor device of claim 13, wherein the semiconductor die comprises a bond pad, and the dummy conductive layer is disposed between the bond pad and the semiconductor die.

16. A semiconductor device comprising:
    a semiconductor die comprising:
      a bond pad; and
      a protective layer having an opening formed therein;
    a conductive pillar comprising an upper end comprising an upper center region coupled to the bond pad, wherein the protective layer is between an upper periphery of the upper end of the conductive pillar and the bond pad;
    a circuit board;
    a solder coupling a lower end of the conductive pillar to the circuit board; and
    a dummy conductive layer coupled to the bond pad.

* * * * *